(12) United States Patent
Kamiya et al.

(10) Patent No.: US 11,874,511 B2
(45) Date of Patent: Jan. 16, 2024

(54) CONNECTING APPARATUS AND LIGHT CONDENSING SUBSTRATE

(71) Applicant: KABUSHIKI KAISHA NIHON MICRONICS, Tokyo (JP)

(72) Inventors: Hiroshi Kamiya, Tokyo (JP); Yuki Komai, Tokyo (JP); Hisao Narita, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 0 days.

(21) Appl. No.: 17/583,778

(22) Filed: Jan. 25, 2022

(65) Prior Publication Data

US 2022/0260792 A1     Aug. 18, 2022

(30) Foreign Application Priority Data

Feb. 15, 2021   (JP) .................................. 2021-021786

(51) Int. Cl.
*G02B 6/42*       (2006.01)
*G01R 31/311*    (2006.01)

(52) U.S. Cl.
CPC .......... *G02B 6/4206* (2013.01); *G01R 31/311* (2013.01)

(58) Field of Classification Search
CPC .................................. G01B 31/31; G02B 6/42

(Continued)

(56) References Cited

U.S. PATENT DOCUMENTS 5,622,567 A * 4/1997 Kojima ............... C23C 14/3471
                                                      427/596
5,909,523 A * 6/1999 Sakaino ................... G02B 6/42
                                                      385/52

(Continued)

FOREIGN PATENT DOCUMENTS

CN           110261755 A        9/2019
JP           2019035694 A       3/2019

(Continued)

OTHER PUBLICATIONS

First Office Action dated Nov. 30, 2022 in the corresponding Taiwan Patent Appln. No. 110114066.

*Primary Examiner* — Kaveh C Kianni
(74) *Attorney, Agent, or Firm* — BACON&THOMAS,PLLC

(57) ABSTRACT

[Problem] To allow to condense and guide the light emitted by a light emitting element having a large light emission surface to an optical connector, in inspection of a semiconductor integrated circuit.
[Solution] The present disclosure provides a connecting apparatus used at the time of inspection of a semiconductor integrated circuit, and the connecting apparatus includes an electric connector electrically connecting to an electrode terminal of the semiconductor integrated circuit, an optical connector optically connecting to an optical terminal of the semiconductor integrated circuit, a connector support substrate configured to support the electric connector and the optical connector so that an end part of the electric connector and an end part of the optical connector respectively connect to the semiconductor integrated circuit, and a light condensing substrate configured to condense light emitted by an optical terminal of the semiconductor integrated circuit to the optical connector.

7 Claims, 8 Drawing Sheets

(58) Field of Classification Search
USPC .......................................................... 385/31
See application file for complete search history.

(56) References Cited

U.S. PATENT DOCUMENTS

| | | | | |
|---|---|---|---|---|
| 5,937,120 | A * | 8/1999 | Higashi ................. | H01S 5/146 372/102 |
| 6,332,719 | B1 * | 12/2001 | Nishikawa ........... | G02B 6/4224 385/88 |
| 6,684,007 | B2 * | 1/2004 | Yoshimura ............... | G02B 6/43 257/E25.032 |
| 6,690,845 | B1 * | 2/2004 | Yoshimura ............ | G02B 6/124 257/E25.032 |
| 9,739,962 | B2 * | 8/2017 | Brenner ............... | G02B 6/4284 |
| 10,082,633 | B2 * | 9/2018 | Schaevitz ............ | G02B 6/4228 |
| 10,690,590 | B2 * | 6/2020 | Hruska ................. | G01J 3/0272 |
| 10,948,658 | B2 * | 3/2021 | Florian Lohse ..... | G02B 6/4227 |
| 2002/0039464 | A1 * | 4/2002 | Yoshimura ............... | H01L 24/24 257/E25.032 |
| 2002/0076161 | A1 * | 6/2002 | Hirabayashi ......... | G02B 6/4201 385/39 |
| 2003/0026303 | A1 * | 2/2003 | Ouchi .................... | H01S 5/423 372/50.1 |
| 2003/0053501 | A1 * | 3/2003 | Sekiya ................ | H01S 5/18361 372/50.11 |
| 2003/0086174 | A1 * | 5/2003 | Wakisaka ................. | H01S 5/12 359/566 |
| 2004/0022487 | A1 * | 2/2004 | Nagasaka ............ | G02B 6/4204 385/31 |
| 2004/0091011 | A1 * | 5/2004 | Liu ..................... | G02B 6/12007 372/96 |
| 2007/0122088 | A1 * | 5/2007 | Yoshida ............... | G02B 6/4201 385/92 |
| 2008/0043796 | A1 * | 2/2008 | Jikutani ............... | G02B 6/4202 359/584 |
| 2010/0271690 | A1 * | 10/2010 | Kawakita ............... | G11B 7/127 359/344 |
| 2011/0241564 | A1 * | 10/2011 | Shimizu .............. | H01S 5/18347 372/45.01 |
| 2015/0098675 | A1 * | 4/2015 | Ishiyama ............. | G02B 6/4284 385/14 |
| 2016/0062063 | A1 * | 3/2016 | Ogura .................... | G02B 6/305 264/1.27 |
| 2019/0056458 | A1 * | 2/2019 | Arai .................... | G01R 31/2635 |

FOREIGN PATENT DOCUMENTS

| | | |
|---|---|---|
| TW | 201625908 A | 7/2016 |
| TW | 201913848 A | 4/2019 |
| TW | 201932850 A | 8/2019 |
| TW | M603962 U | 11/2020 |
| TW | 202104905 A | 2/2021 |
| WO | WO2016166564 A1 | 10/2016 |

* cited by examiner

CONNECTING APPARATUS AND LIGHT CONDENSING SUBSTRATE

CROSS-REFERENCE TO RELATED APPLICATIONS

The present application claims, under 35 USC 119, priority of Japanese Patent Application No. 2021-021786 filed on Feb. 15, 2021.

TECHNICAL FIELD

The present disclosure relates to a connecting apparatus and a light condensing substrate, and is applicable to the connecting apparatus used at the time of inspection of a semiconductor integrated circuit which is formed on, for example, a semiconductor wafer and has an electric circuit and an optical circuit.

BACKGROUND ART

In recent years, the techniques relating to a semiconductor integrated circuit (hereinafter, also referred to as "optical device") which is formed on a silicon substrate or the like and has an electric circuit and an optical circuit have been developed. The optical device herein is a light emitting element configured to emit light when supplied with an electric signal, a light receiving element configured to output an electric signal when receiving light, or the like.

An inspection device configured to inspect characteristics of an optical device is used with a connecting apparatus having an electric connector (hereinafter, also referred to as "electric probe") electrically connecting between the optical device and a tester, and an optical connector (hereinafter, also referred to as "optical probe") optically connecting between the optical device and the tester. A plurality of the optical devices are formed on a semiconductor wafer, and this type of connecting apparatus includes the number of electric probes and optical probes corresponding to the number of optical devices.

Examples of the optical device includes VCSEL (Vertical Cavity Surface Emitting Laser). In the case where a plurality of VCSELs formed on a semiconductor wafer are subjected to inspection, the inspection is generally performed by use of an integrating sphere. The plurality of VCSELs simultaneously emitting light are not able to be measured by the measurement method using an integrating sphere, and are thus subjected to measurement by means of single-DUT, in many cases.

The measurement by means of single-DUT takes time and requires much test cost. To deal with this, an optical fiber probe allowing measurement by means of multi-DUT by using an optical fiber has been proposed.

The technique disclosed in Patent Document 1 is one example of the optical fiber probe. In the disclosed technique, an optical fiber condenses the light emitted by an optical device, and the optical fiber propagates the light to a photodiode. The photodiode then outputs light reception current in response to the received light, and a tester measures a value of the light reception current to inspect light intensity of a VCSEL.

CITATION LIST

Patent Literature

[Patent Document 1] Japanese Patent Application Laid-Open Publication No. 2019-35694

SUMMARY OF INVENTION

Technical Problem

A VCSEL is one example of an optical device. Examples of the VCSEL include a single-hole VCSEL in which one element has one light emitting hole (light emitting part), and a porous-type VCSEL in which one element has a plurality of light emitting holes (light emitting parts).

However, the technique disclosed in Patent Document 1 corresponds to the measurement of a single-hole VCSEL, and does not correspond to the measurement of a high-power porous-type VCSEL. The porous-type VCSEL has a large light emission area in one element. Therefore, although as shown in FIG. 8A all of the light emitted by a single-hole VCSEL 95a is made incident on an optical fiber serving as an optical connector 42, as shown in FIG. 8B all of the light emitted by a porous-type VCSEL 95b is hardly made incident on the optical fiber. Accordingly, it is difficult to obtain accurate measurement result of the porous-type VCSEL.

The present disclosure provides a connecting apparatus and a light condensing substrate which are used at the time of inspection of a semiconductor integrated circuit, and allow to condense and guide the light emitted by an optical terminal having a large light emission surface to an optical connector.

Solution to Problem

In order to solve the above problem, the present disclosure in the first aspect provides a connecting apparatus used at the time of inspection of a semiconductor integrated circuit, and the connecting apparatus includes an electric connector electrically connecting to an electrode terminal of the semiconductor integrated circuit, an optical connector optically connecting to an optical terminal of the semiconductor integrated circuit, a connector support substrate configured to support the electric connector and the optical connector so that an end part of the electric connector and an end part of the optical connector respectively connect to the semiconductor integrated circuit, and a light condensing substrate configured to condense light emitted by the optical terminal of the semiconductor integrated circuit to the optical connector.

The present disclosure in the second aspect provides a light condensing substrate electrically connecting an electric connector to an electrode terminal of a semiconductor integrated circuit so as to guide light emitted by an optical terminal of the semiconductor integrated circuit to an optical connector. In the light condensing substrate, the light emitted by the optical terminal of the semiconductor integrated circuit is condensed to the optical connector.

Advantageous Effect of Invention

The present disclosure allows to condense and guide the light emitted by an optical terminal having a large light emission surface to an optical connector.

DESCRIPTION OF EMBODIMENTS

A: Embodiment

Figure 1:
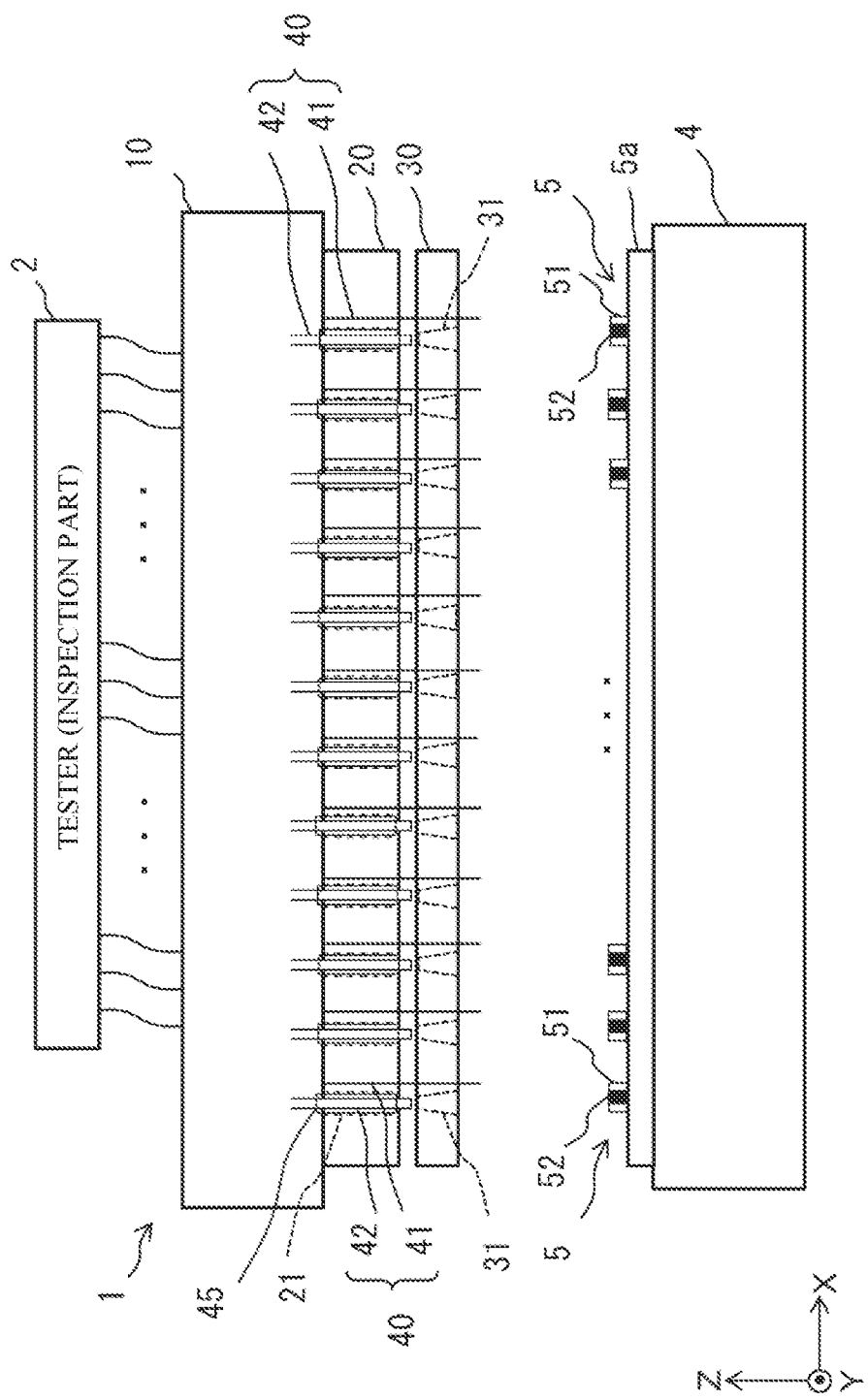
FIG. 1 is an entire configuration diagram illustrating the entire configuration of an inspection device according to the embodiment.

An embodiment of the light condensing substrate and the connecting apparatus according to the present disclosure will be described below in detail by referring to the drawings.

A-1: Configuration of Embodiment

The present embodiment exemplifies the case where the present disclosure is applied to the connecting apparatus to be attached to the inspection device configured to inspect characteristics of a plurality of semiconductor integrated circuits (hereinafter, also referred to as "optical devices") which are formed on a semiconductor wafer and have an electric circuit and an optical circuit.

The "inspection object" in the following description is an object to be inspected for characteristics by the inspection device. Examples of the inspection object include an optical device having an electric circuit and an optical circuit, and a semiconductor wafer. The optical device serving as the inspection object may be a light emitting element or a light receiving element.

The optical device serving as the inspection object has an electrode terminal (hereinafter, also referred to as "electrode") and an optical terminal (hereinafter, also referred to as "optical end face," "light emitting part," or "light receiving part") indicating a part emitting light or receiving light. The semiconductor wafer serving as the inspection object has a plurality of optical devices with circuit patterns formed, and a state prior to dicing is assumed.

The "connecting apparatus" includes a plurality of connectors configured to electrically and optically connect to the electrode terminals and the optical terminals of the inspection object. Examples of the connecting apparatus include a probe card. The connecting apparatus in the following description is referred to as a probe support substrate 20.

In the case where the optical device serving as the inspection object is a light emitting element, as an example, the light emitted by the inspection object is incident on the connecting apparatus via an optical connector. The connecting apparatus is thus also referred to as "light receiving type electrical connecting apparatus." In the case where the optical device serving as the inspection object is a light receiving element, as an example, the light passing through the optical connector is emitted to the inspection object. The connecting apparatus is thus also referred to as "light emitting type electrical connecting apparatus."

The "connector" is configured to electrically connect to the electrode of the optical device serving as the inspection object and further optically connect to the optical terminal of the optical device. That is, the connector has the electric connector (hereinafter, also referred to as "electric probe") configured to electrically connect to the electrode of the inspection object, and the optical connector (hereinafter, referred to as "optical probe") configured to optically connect to the optical terminal of the inspection object. In other words, the connector includes a pair of probes, in which an electric probe and an optical probe are provided in a pair for each optical device. The optical probe may be, for example, an optical fiber, but not limited thereto, or alternatively may be a linear optical member.

A-2: Detailed Configuration of Inspection Device

FIG. 1 is the entire configuration diagram illustrating the entire configuration of the inspection device according to the embodiment. In FIG. 1, an inspection device 1 includes a tester 2, a wiring substrate 10, the probe support substrate 20 attached on one surface (for example, the lower surface) of the wiring substrate 10, and a light condensing substrate 30 attached on one surface (for example, the lower surface) of the probe support substrate 20.

The inspection device 1 is configured to inspect characteristics of each of a plurality of optical devices 5 formed on a semiconductor wafer 5a. The probe support substrate 20, which is also referred to as a probe card, includes a plurality of connectors 40 used in inspection of the characteristics of the optical devices 5.

FIG. 1 schematically shows the major components of the inspection device 1. The components of the inspection device 1 are not limited to these. In the assembling step of attaching the probe support substrate 20 to the wiring substrate 10, the probe support substrate 20 is fixed by use of a fixing member, for example, a bolt. However, none of fixing members are shown in FIG. 1. It should be noted that the substrate thicknesses and dimensions of the wiring substrate 10, the probe support substrate 20 and the light condensing substrate 30, and the diameters and lengths of the connectors 40 differ from the actual ones. Moreover, the components of the wiring substrate 10, the probe support substrate 20, the light condensing substrate 30, the connectors 40 or the like are not limited to those shown in FIG. 1, with respect to material, shape, structure or arrangement.

In the arrangement directions of the plurality of connectors 40 provided to the probe support substrate 20, one direction is defined as an X axis direction, the direction orthogonal to the X axis direction on the surface of the probe support substrate 20 is defined as a Y axis direction, and the direction orthogonal to the X axis direction and the Y axis direction is defined as a Z axis direction.

[Inspection Object]

The optical device 5 is a semiconductor integrated circuit having an electric circuit and an optical circuit. The optical device 5 may be a light emitting element configured to emit light when supplied with an electric signal, or a light receiving element configured to output an electric signal when receiving light. In an example, the optical device 5 may be a silicon photonics chip, a VCSEL or the like.

In particular, in the example according to the present embodiment, the optical device 5 is a porous-type VCSEL having a plurality of light emitting holes (light emitting parts) in one element.

The optical device 5 has an electrode terminal 51 configured to supply an electric signal, and an optical terminal 52 configured to emit light when supplied with an electric signal.

The semiconductor wafer 5a on which the plurality of optical devices 5 are formed is placed on the upper surface of a stage 4. In the inspection of the characteristics of the optical device 5, the probe support substrate 20 connecting to the tester 2 is pressed against the semiconductor wafer 5a. This brings an electric connector 41 of the connector 40 provided to the probe support substrate 20 and the electrode terminal 51 of the optical device 5 into electrical contact with each other, and further brings an optical connector 42 of the connector 40 and the optical terminal 52 of the optical device 5 into optical contact with each other.

The electric signal output by the tester 2 is thereafter supplied to the optical device 5 via the electric connector 41. When the electric signal is supplied thereto, the optical terminal 52 of the optical device 5 emits light, and the emitted light is supplied to the tester 2 via the optical connector 42. The optical connector 42 is provided with a photoelectric conversion part such as a photodiode. The tester 2 measures a value of light reception current of the photodiode, and inspects the characteristics of the optical device 5. The tester 2 is capable of simultaneously inspecting the plurality of optical devices 5 formed on the semiconductor wafer 5a.

[Tester 2]

The tester 2 is the inspection part configured to inspect characteristics of each of the optical devices 5 formed on the semiconductor wafer 5a, via the probe support substrate 20.

[Wiring Substrate 10]

The wiring substrate 10 is formed in a round shape. The wiring substrate 10 may be a printed wiring substrate formed of resin material, for example, polyimide. The wiring substrate 10 supports the probe support substrate 20 attached on one surface (for example, the lower surface) of the wiring substrate 10.

The wiring substrate 10 is configured to electrically connect between each of the electric connectors 41 of the probe support substrate 20 and the tester 2. In an example, the wiring substrate 10 includes, on the peripheral edge of the other surface (for example, the upper surface), a connection terminal (not shown) formed to electrically connect to the test head (not shown) of the tester 2. The wiring substrate 10 further includes, on one surface (for example, the lower surface), a wiring pattern formed to electrically connect to each of the electric connectors 41 of the probe support substrate 20. The wiring substrate 10 further contains a conduction path formed to electrically connect between the wiring pattern and the connection terminal. Accordingly, the tester 2 is electrically connected to each of the electric connectors 41 via the connection terminal and the wiring pattern of the wiring substrate 10.

The wiring substrate 10 is configured to connect between each of the optical connectors 42 of the probe support substrate 20 and the connection terminal of the tester 2. In an example, the wiring substrate 10 may be configured to connect a bundle of the optical fibers serving as the optical connectors 42 provided to the probe support substrate 20 to the connection terminal of the tester 2.

It is noted that a plurality of electronic components necessary for the inspection of the characteristics of the optical device 5 may be disposed on the upper surface of the wiring substrate 10.

[Probe Support Substrate 20]

The probe support substrate 20 is a plate-like member formed of an electrically insulating member, for example, ceramic. The probe support substrate 20 is attached on one surface (for example, the lower surface) of the wiring substrate 10.

The probe support substrate 20 includes the plurality of connectors 40 having the electric connectors 41 and the optical connectors 42. The lower ends of the electric connectors 41 and the lower ends of the optical connectors 42 protrude from the lower surface of the probe support substrate 20.

One example of the support structure of the electric connectors 41 and the optical connectors 42 in the probe support substrate 20 will be described below.

An example of the support structure of the optical connectors 42 will be described, first. In an example, the probe support substrate 20 has a plurality of through holes 21 which penetrate the substrate in the thickness direction (Z axis direction, plate thickness direction) of the substrate.

The through holes 21 are formed at the positions corresponding to the positions of the electrode terminals 51 and the optical terminals 52 of the optical devices 5 formed on the semiconductor wafer 5a. The probe support substrate 20 includes the through holes 21 as many as the optical devices 5. In the present example, each of the through holes 21 of the probe support substrate 20 has a substantially round shape in the cross-sectional view. The shape of each of the through holes 21 in the cross-sectional view is not limited thereto, and may be a substantially oval shape, a square shape, a rectangular shape or a polygonal shape.

A tubular member 45 is inserted into each of the through holes 21 formed in the probe support substrate 20. The optical connector 42 connecting to the tester 2 is inserted into the tube of the tubular member 45. The optical connector 42 inserted into the tube of the tubular member 45 is made to adhere to the tubular member 45, while the tubular member 45 inserted into the through hole 21 is not made to adhere thereto. Accordingly, when the optical connector 42 needs to be replaced, the optical connector 42 together with the tubular member 45 is able to be replaced individually.

An example of the support structure of the electric connectors 41 will be described, next. In an example, a wiring pattern (not shown) is formed on the lower surface of the probe support substrate 20. The wiring pattern is configured to electrically connect to the electric connector 41. The probe support substrate 20 further contains a conduction path (not shown) formed to electrically connect between the wiring pattern formed on the lower surface of the probe support substrate 20 and the wiring pattern of the wiring substrate 10. This allows to electrically connect between the electric connector 41 and the wiring substrate 10 via the conduction path and the wiring pattern of the probe support substrate 20.

[Tubular Member 45]

The tubular member 45 is a tubular member (ferrule) formed of electrically insulating material. It is noted that the tubular member 45 may be formed of a conductive member. The tubular member 45 is configured to be inserted into each of the through holes 21 of the probe support substrate 20.

The tubular member 45 is formed to have the external dimension (that is, outer diameter) substantially equal to or slightly smaller than the inner diameter of the through hole 21 into which the tubular member 45 is inserted. That is, the tubular member 45 has the structure allowing to be inserted into and removed from the through hole 21.

On the other hand, the tube of the tubular member 45 is formed to have the inner diameter substantially equal to or slightly larger than the outer shape of the optical fiber serving as the optical connector 42. That is, the tubular member 45 has the structure allowing the optical fiber serving as the optical connector 42 to be inserted into and removed from the tube of the tubular member 45.

The tubular member 45 is configured to be inserted into the through hole 21 of the probe support substrate 20, without direct adhesion between the tubular member 45 and the through hole 21. That is, the tubular member 45 is configured to be attachable to and removable from the through hole 21 of the probe support substrate 20. On the other hand, with regard to the optical connector 42 to be inserted into the tube of the tubular member 45, the optical connector 42 is fixed inside the tube of the tubular member 45. In an example, the inner wall surface of the tube of the tubular member 45 and the outer wall surface of the optical fiber serving as the optical connector 42 are made to adhere to each other. It is noted that the optical connector 42 may be fixed by adhesion or the like inside the tubular member 45, or may be mechanically and removably provided in the tubular member 45. This allows the optical connector 42 together with the tubular member 45 to be removed from the probe support substrate 20 in the case where the optical connector 42 needs to be replaced due to damage, performance deterioration or the like. That is, the optical connector 42 having damage or the like is allowed to be individually replaced, without the need of replacement of the whole of the probe support substrate 20.

[Connector 40]

The connector 40 has the electric connector 41 configured to electrically connect to the electrode terminal 51 of the optical device 5, and the optical connector 42 configured to optically connect to the optical terminal 52 of the optical device 5. The connector 40 includes the electric connector 41 and the optical connector 42 in a pair.

A-3: Detailed Explanation of Light Condensing Substrate 30

The light condensing substrate 30 is configured to condense the light emitted by the optical device 5 and guide the light to the corresponding optical connector (optical fiber) 42. The light condensing substrate 30 is disposed between the probe support substrate 20 and the optical device 5 placed on the semiconductor wafer 5a.

The light condensing substrate 30 has a plurality of through holes which penetrate the substrate in the thickness direction (Z axis direction, plate thickness direction) of the substrate, and each of the through holes functions as a light condensing part 31. The light condensing parts 31 formed in the light condensing substrate 30 are disposed at the positions corresponding to the positions of the optical terminals 52 of the optical devices 5.

Figure 2:
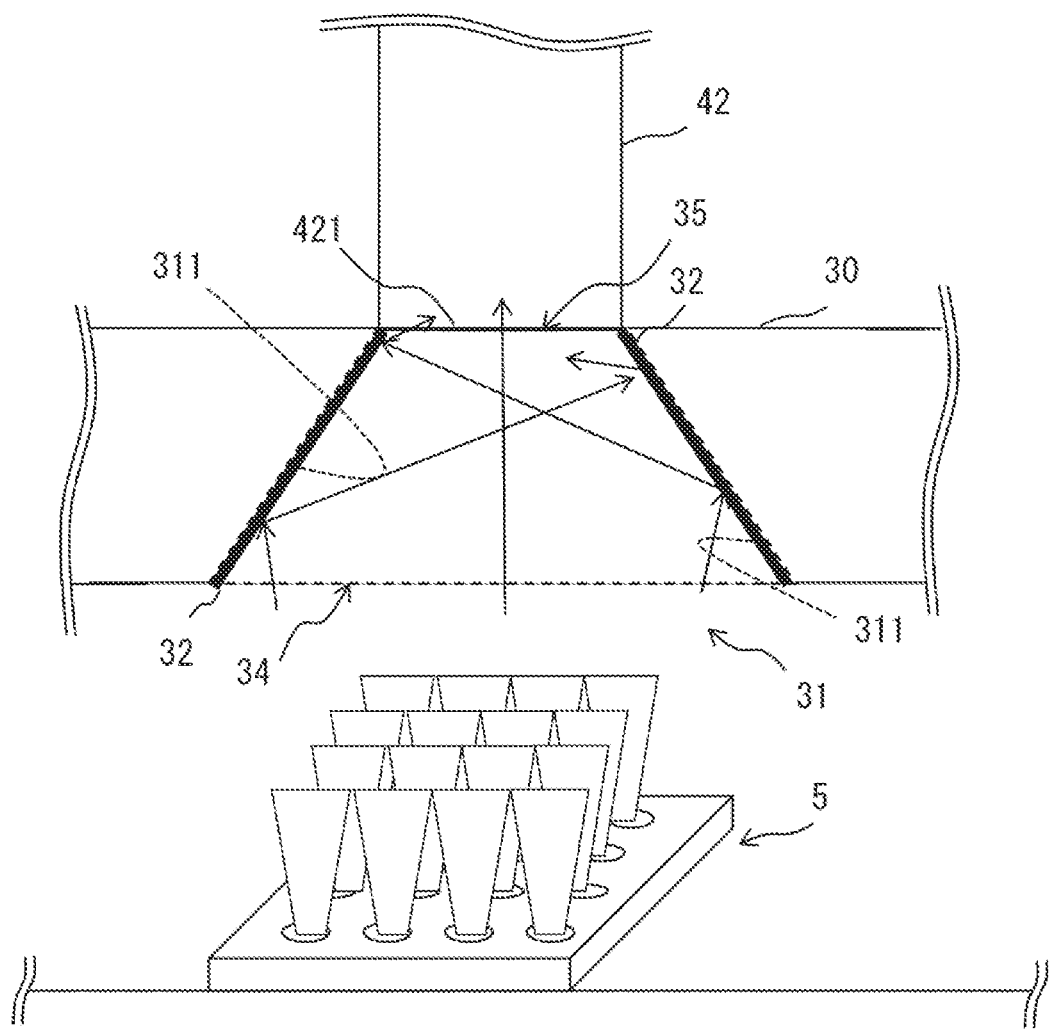
FIG. 2 is a structural drawing illustrating a light condensing structure of a light condensing substrate according to the embodiment.

FIG. 2 is the structural drawing illustrating the light condensing structure of the light condensing substrate 30 according to the embodiment.

For convenience of explanation, FIG. 2 shows that one light condensing part 31 out of the plurality of light condensing parts 31 formed in the light condensing substrate 30 condenses the light emitted by the optical device 5 which is a porous-type VCSEL, and guides the light to the optical fiber serving as the optical connector 42.

The light condensing part 31 may be the through hole having the truncated cone shape in which the radius of the lower part is larger than the radius of the upper part. In other words, the area of the lower part of the light condensing part 31 is larger than the area of the upper part. The lower part side of the light condensing part 31 having such a truncated cone shape is opposed to the optical device 5 of a porous-type VCSEL or the like, and the upper part side of the light condensing part 31 corresponds to the lower end of the optical connector 42. The area of the lower part of the light condensing part 31 having such a truncated cone shape is formed so as to be larger than the light emission region (light emission area) of the porous-type VCSEL. It is noted that the lower part of the light condensing part 31 is also referred to as a large aperture part 34, and the upper part is also referred to as a small aperture part 35.

In an example, the VCSEL serving as the optical device 5 vertically emits an infrared laser from the optical end face serving as the optical terminal 52. In the case of the porous-type VCSEL serving as the optical device 5, the porous-type VCSEL has a plurality of the optical terminals 52, and thus the area of the light emission surface of the porous-type VCSEL is larger than the area of the light emission surface of a single-hole VCSEL. Accordingly, it is difficult for all of the light to be made incident on the optical connector 42.

Therefore, the light condensing substrate 30 is disposed between the porous-type VCSEL serving as the optical device 5 and the optical fiber serving as the optical connector 42, so that the light condensing part 31 of the light condensing substrate 30 condenses the light emitted by the optical device (porous-type VCSEL) 5 and guides the light to the optical connector (optical fiber) 42. This allows all of the light emitted by the porous-type VCSEL to be incident on the optical connector (optical fiber) 42. The optical connector 42 is configured to connect to a photodiode (not shown), and thus the light intensity of the light emitted by the porous-type VCSEL is able to be measured when the photodiode outputs light reception current.

It is noted that another method of condensing the light emitted by the VCSEL to the optical connector (optical fiber) 42 is available, in which only a lens is arranged between the VCSEL and the optical connector 42 without the arrangement of the light condensing substrate 30 of the present embodiment. In this case, it is necessary to adjust the alignment of the lens and the optical connector 42 with high accuracy. The individual difference of the lenses also requires the need of adjusting the alignment of the lens and the optical connector 42. If the alignment is not performed with appropriate accuracy, the optical connector 42 may not receive all of the light emitted by the VCSEL, and therefore the accurate measurement result of the VCSEL may be hardly obtained. On the other hand, as in the present embodiment, the arrangement of the light condensing substrate 30 allows to condense the light emitted by the VCSEL to the optical connector 42 without the need of adjusting the alignment with high accuracy, and further allows to obtain the measurement result with high accuracy.

The light condensing part 31 of the through hole having such a truncated cone shape includes an inner wall 311 which is coated (film-formed) with an optical thin film 32 formed of a metal having high light reflectance (for example, aluminum, gold, or silver) by sputtering, vapor deposition or the like. The optical thin film 32 functions as a light reflecting film.

Some of the laser light incident on the light condensing part 31 is made directly incident on the optical connector (optical fiber) 42, and some of the laser light is guided to the upper part side (small aperture part) of the light condensing part 31 while being reflected by the optical thin film 32 of the inner wall 311 of the light condensing part 31, and eventually made incident on the optical connector 42. The optical thin film 32, which is formed of a metal having high light reflectance, is capable of suppressing the attenuation of the light intensity of the light emitted by the optical device 5.

In order to suppress the attenuation of the light intensity of the light emitted by the optical device 5, it is desirable to reduce the number of times of reflection as much as possible by optimally adjusting the angle of the light reflection (the angle of the inner wall 311 of the light condensing part 31).

Figure 3:
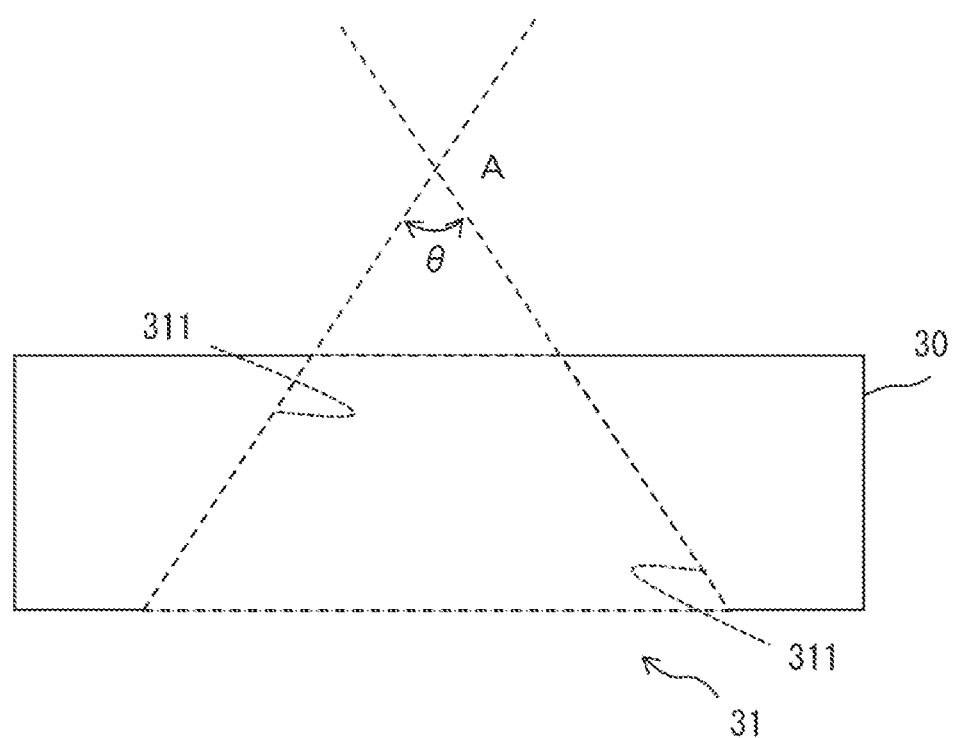
FIG. 3 is an explanatory drawing illustrating a conical angle in the embodiment.

In the case of the light condensing part 31 formed to have a larger conical angle, the light condensing substrate 30 may be formed to have a thinner thickness. The "conical angle" herein refers to the vertex angle in a diameter sectional view of the cone formed by making the lines extended along the wall surface of the truncated cone intersect with each other, and is shown as an angle θ of a point A in FIG. 3.

It is noted that every time the incident laser light is reflected by the inner wall 311, the laser light travels at a larger angle, so that the number of times of reflection increases. If the light condensing part 31 is formed to have an excessively large conical angle, the laser light is not able to reach the opening part of the small aperture part 35 of the light condensing part 31, and the laser light eventually travels in the opposite direction toward the large aperture part 34 of the light condensing part 31.

The amount of angle change occurring at one time of reflection is twice the conical angle. As the light emission surface (optical terminal 52) of the VCSEL serving as the optical device 5 is larger, the number of times of reflection before the light condensing is greater. Accordingly, it is necessary to select the optimal conical angle by considering the radiation angle of the VCSEL.

That is, the light emitted by the VCSEL is made incident on the light condensing part 31 while radiating outward. Accordingly, it is necessary to consider the radiation angle of the light made incident on the light condensing part 31. It is also necessary to consider the relation with the diameter of the optical fiber serving as the optical connector 42.

Figure 4:
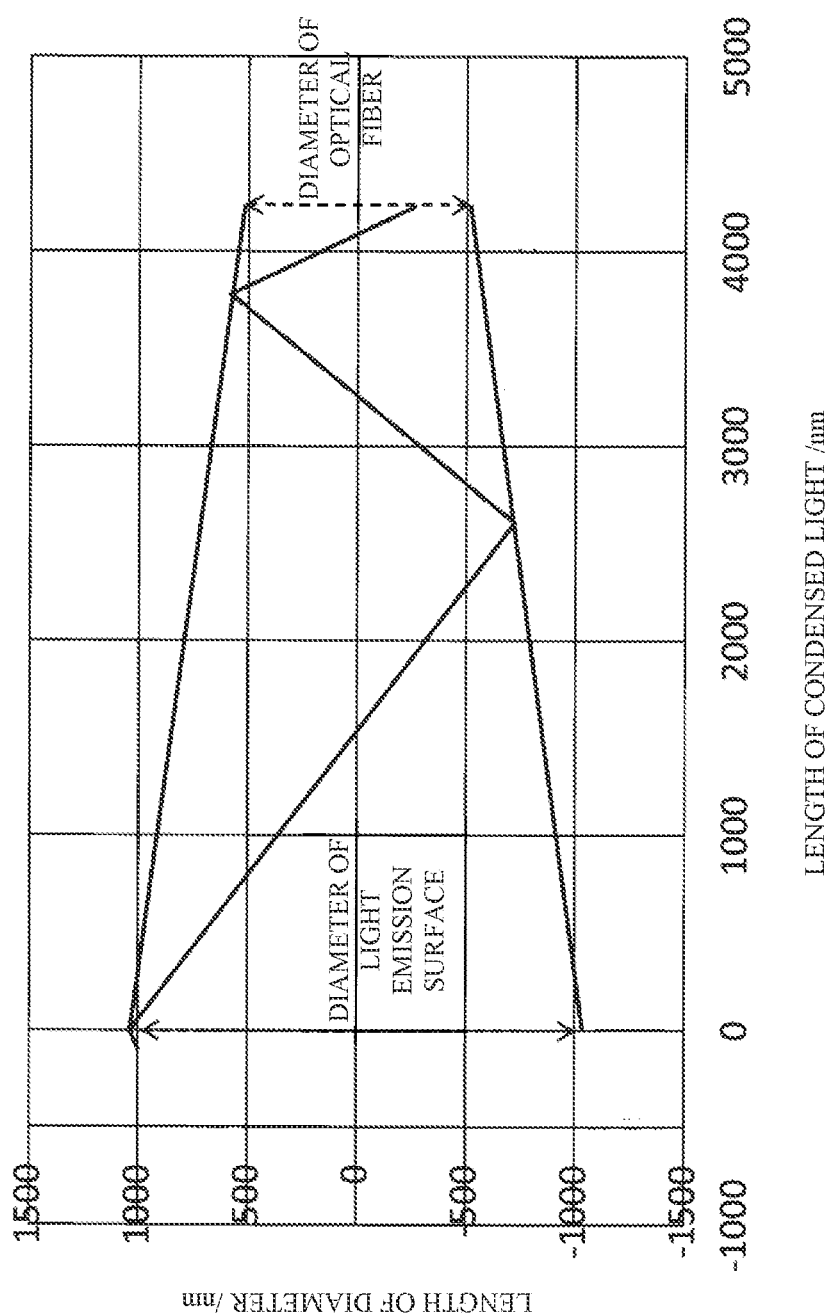
FIG. 4 shows one example of a simulation result with respect to the number of times of reflection in which light is reflected by an inner wall of a light condensing part according to the embodiment.

FIG. 4 shows one example of the simulation result with respect to the number of times of reflection in which light is reflected by the inner wall 311 of the light condensing part 31 according to the embodiment.

In the example, the diagonal dimension of the light emission surface of the optical device 5 is 2 mm, and the diameter of the optical fiber is 1 mm. The radiation angle of the light made incident on the light condensing part 31 is set to 20 degree, and the conical angle is set to 7 degree. When the reflection in this case is simulated by considering that the amount of angle change occurring at one time of reflection becomes twice, and further considering the radiation angle of the incident light, the maximum number of times of reflection is three. In the present example, the light condensing substrate 30 may be formed to be thin, approximately 4.25 mm (4250 nm).

It is noted that the simulation result with respect to the number of times of reflection shown in FIG. 4 is merely one example, not limited thereto. In the case where some conditions are changed, such as the dimension of the light emission surface of the optical device 5 or the radiation angle of the incident light, the optimal number of times of reflection is able to be obtained accordingly.

A-4: Effects of Embodiment

As described above, in the present embodiment, even in the case where all of the light emitted by the optical device 5 is difficult to be made incident on the optical connector 42, the arrangement of the light condensing substrate 30 configured to condense the light emitted by the optical device 5 and guide the light to the optical connector 42 allows all of the light to be made incident on the optical connector 42.

In the present embodiment, the inner wall 311 of the light condensing part 31 provided in the light condensing substrate 30 is coated with the optical thin film 32 having high light reflectance, thereby enabling to suppress the amount of attenuation of the reflected light.

Furthermore, in the present embodiment, the optimal number of times of reflection is able to be obtained by adjusting the conical angle of the light condensing part 31 in consideration of the radiation angle of the light made incident on the light condensing part 31 of the light condensing substrate 30.

B: Other Embodiments

Various types of the modifications have been described in the above embodiments. The present disclosure is further applicable to the following modifications.

B-1: Modification of Light Condensing Structure

A modification of the light condensing structure allowing to condense the laser light to the optical connector 42 through the light condensing part 31 of the light condensing substrate 30 will be described below by referring to FIG. 5 to FIG. 7.

Figure 5:
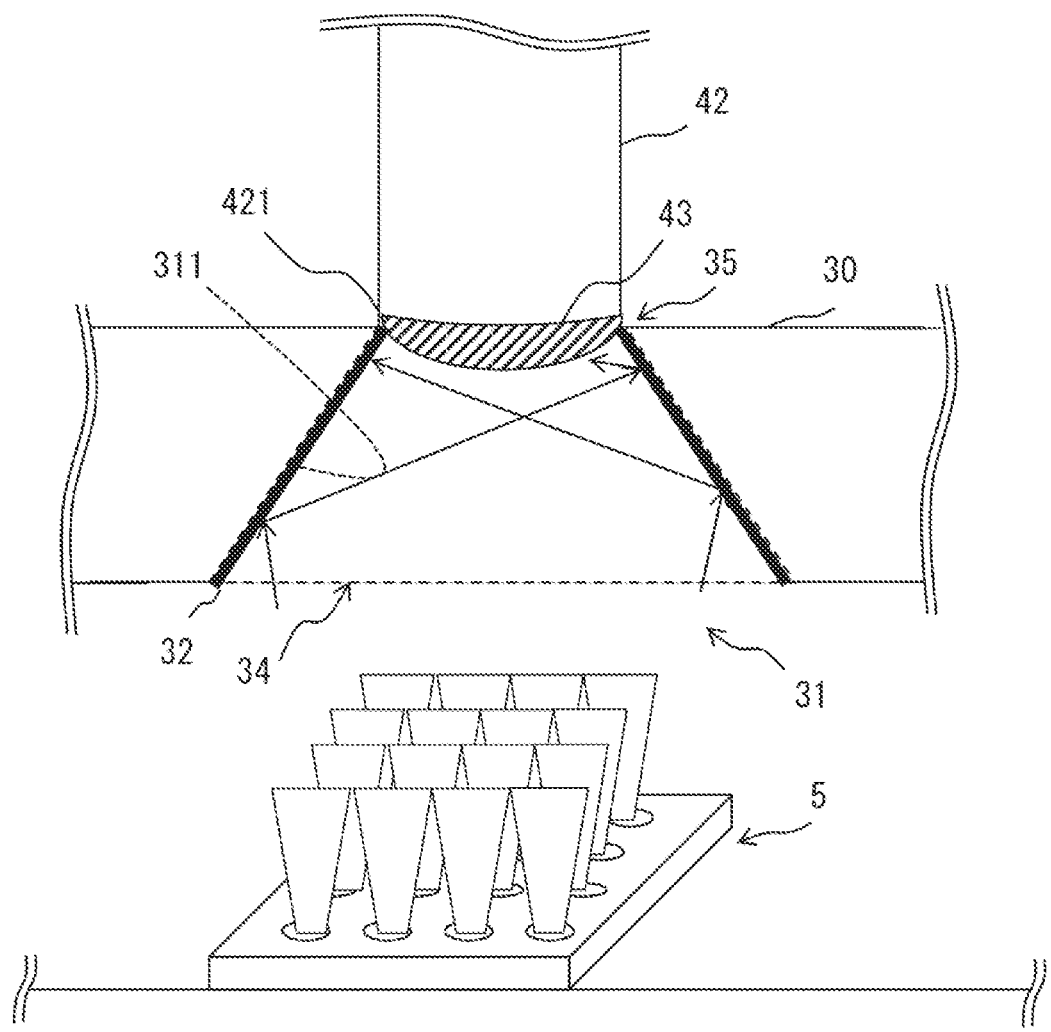
FIG. 5 is an explanatory drawing (part 1) illustrating a modification of the light condensing structure.

FIG. 5 is the explanatory drawing illustrating a modification of the light condensing structure. In the present example, a lens 43 is arranged to an incident part 421 located at the lower end part (end part) of the optical connector 42. The laser light emitted by the optical device 5 is condensed by the light condensing part 31 having a truncated cone shape, further refracted by the lens 43, and eventually made incident on the optical connector 42. This makes all of the laser light emitted by the optical device 5 incident on the optical connector 42.

It is noted that the material of the lens 43 is not especially limited, and may be synthetic resin, glass or the like. The lens 43 is preferably a convex lens. However, a concave lens shall not be excluded, and the lens 43 may be a concave lens. Although FIG. 5 shows the example in which the lens 43 is arranged to the incident part 421 of the optical connector 42, the lens 43 may be arranged to the small aperture part 35 of the light condensing part 31. Moreover, although in the example one lens 43 is arranged to the incident part 421 of the optical connector 42, a plurality of the lenses 43 may be arranged, as long as the arrangement exhibits the same effects. As an available structure, one lens 43 is arranged to the small aperture part 35, and another lens 43 is additionally arranged to the incident part 421. The lens 43 is merely one example. The optical element may be a light condensing plate which is curved or has a light condensing function, not limited to the lens 43, as long as the optical element makes the laser light traveling toward the small aperture part 35 of the light condensing part 31 incident on the optical connector 42.

Figure 6:
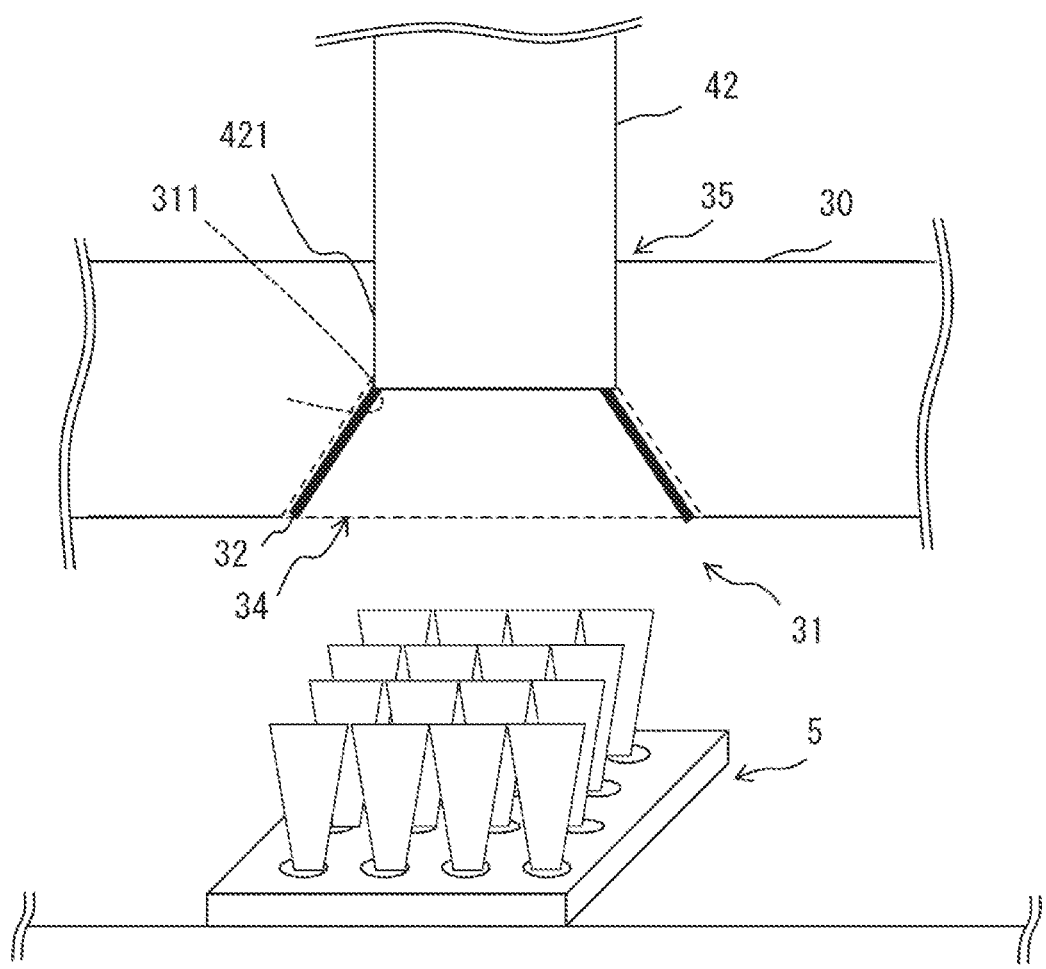
FIG. 6 is an explanatory drawing (part 2) illustrating another modification of the light condensing structure.

FIG. 6 shows the structure in which the lower end part (end part) of the optical connector 42 is fitted in the small aperture part 35 of the light condensing part 31 of the light condensing substrate 30. That is, the incident part 421 of the optical connector 42 is contained in the light condensing part 31. In an example, the laser light emitted by the optical device 5 leaks in the side of the small aperture part 35 of the light condensing part 31, in some cases. On the other hand, the structure shown in FIG. 6 makes all of the laser light emitted by the optical device 5 incident on the optical connector 42 without leakage, since the incident part 421 of the optical connector 42 is contained in the light condensing part 31.

It is noted that, in the case of the example shown in FIG. 6, the light condensing part 31 may be formed to have the upper part in a cylindrical shape in order to contain the incident part 421, and have the lower part in a truncated cone shape. That is, the light condensing part 31 may be formed to have the upper part in the shape fitted to the shape of the end part of the optical connector 42. The light leakage prevention structure allowing to prevent light leakage may be applied to the contact part between the light condensing part 31 of the light condensing substrate 30 and the optical connector 42. It is noted that such a light leakage prevention structure may be applied not only to the example shown in FIG. 6, but may also be applied to any of the embodiments in the present disclosure. In the example shown in FIG. 6, no lens is arranged to the incident part 421 of the optical connector 42. Alternatively, the lens 43 may be arranged to the incident part 421 of the optical connector 42 as in the example shown in FIG. 5.

Figure 7:
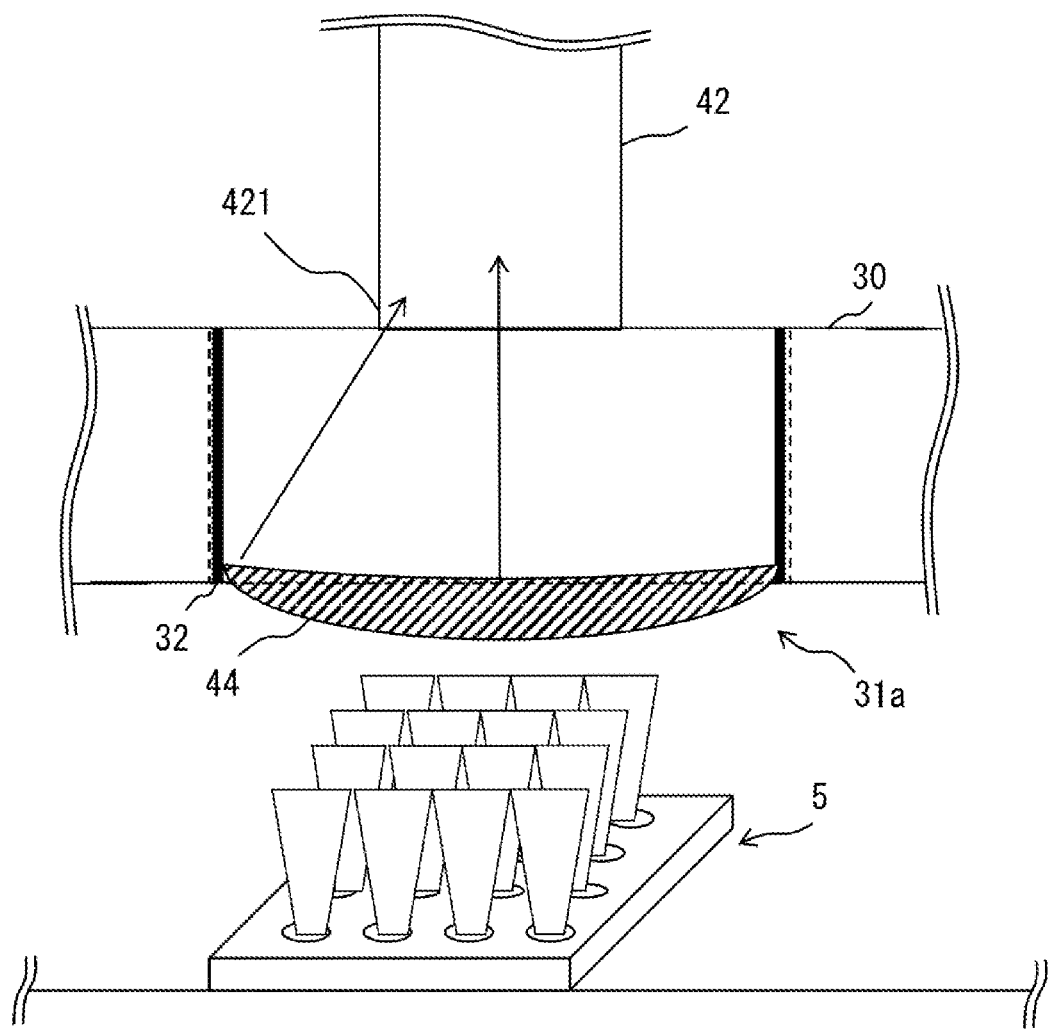
FIG. 7 is an explanatory drawing (part 3) illustrating another modification of the light condensing structure.
Figure 8:
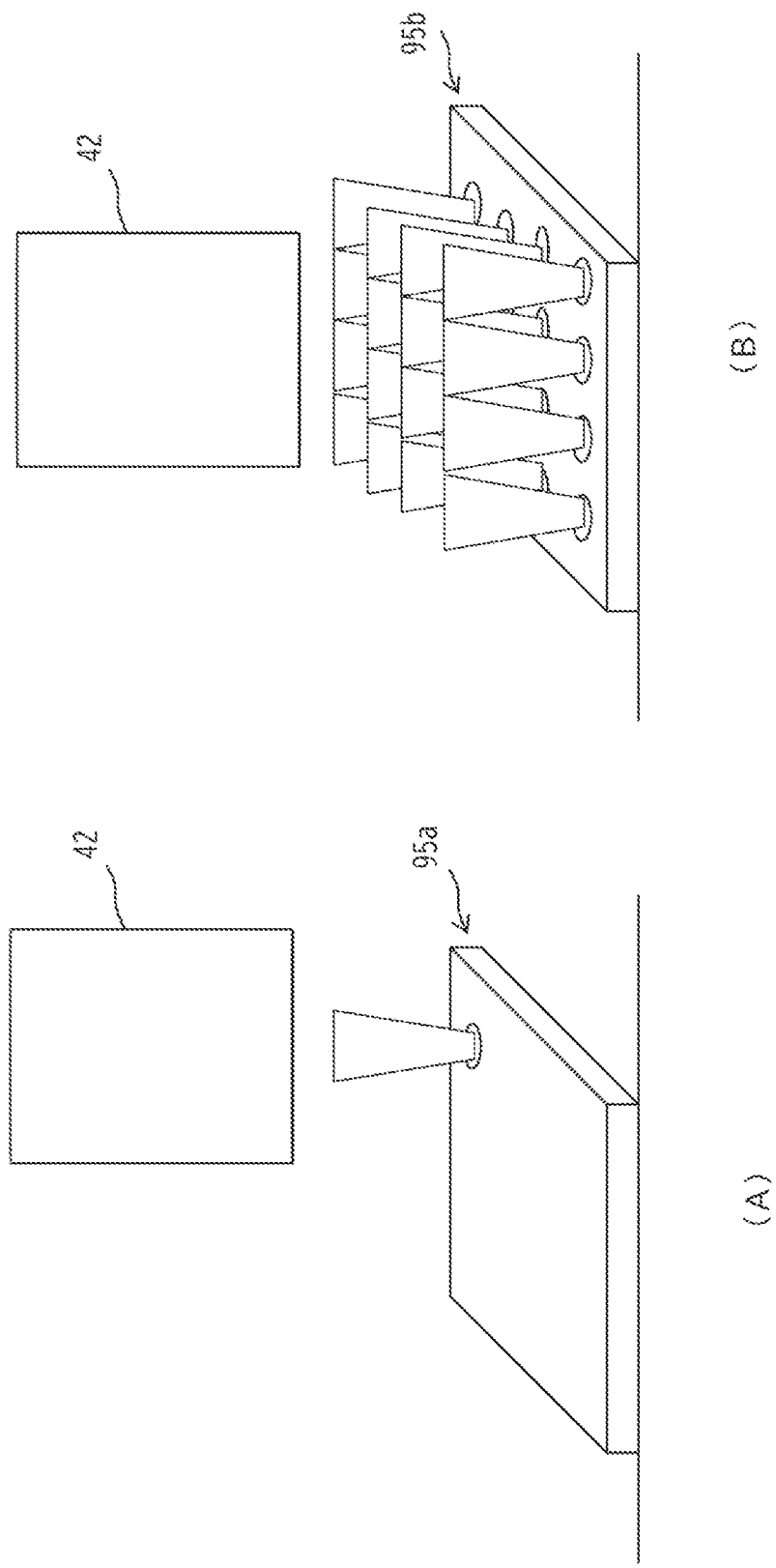
FIG. 8 is an explanatory drawing illustrating a problem.

FIG. 7 shows the case in which a lens 44 is arranged to the lower part of a light condensing part 31a of the light condensing substrate 30. FIG. 7 shows that the light condensing part 31a has a cylindrical shape. The example is also applicable to the light condensing part 31 having a truncated cone shape. In an example, the laser light emitted by the optical device 5 leaks in the lower part side of the light condensing part 31a, in some cases. On the other hand, the structure shown in FIG. 7 having the lens 44 arranged to the lower part of the light condensing part 31a allows to prevent such light leakage in the lower part side of the light condensing part 31a.

It is noted that the structure allowing to prevent such light leakage in the lower part side of the light condensing part 31a shown in FIG. 7 is not limited to the example shown in FIG. 6, and may be applied to any of the embodiments in the present disclosure. The material of the lens 44 is not especially limited, and may be synthetic resin, glass or the like. The lens 44 is preferably a convex lens, or alternatively may be a concave lens. The lens 44 is merely one example. The optical element may be a light condensing plate which is curved or has a light condensing function, not limited to the lens 44.

B-2: The tester 2 is configured to inspect one semiconductor wafer 5a on which the plurality of optical devices 5 are formed. In the prior art, the tester 2 inspects the optical devices 5 formed on the semiconductor wafer 5a, one by one. Therefore, it takes long time for the tester 2 to inspect one semiconductor wafer 5a. To deal with this, the tester 2 may simultaneously inspect the plurality of optical devices 5, by transmitting an electric signal (test signal) to the plurality of optical devices 5 formed on one semiconductor wafer 5a, and making the plurality of optical devices 5 emit light.

REFERENCE SIGNS LIST

1 INSPECTION DEVICE
2 TESTER (INSPECTION PART)
4 STAGE
5 OPTICAL DEVICE
5a SEMICONDUCTOR WAFER
51 ELECTRODE TERMINAL
52 OPTICAL TERMINAL
10 WIRING SUBSTRATE
20 PROBE SUPPORT SUBSTRATE
21 THROUGH HOLE
30 LIGHT CONDENSING SUBSTRATE
31 and 31a LIGHT CONDENSING PART
311 INNER WALL
32 OPTICAL THIN FILM
34 LARGE APERTURE PART
35 SMALL APERTURE PART
40 CONNECTOR
41 ELECTRIC CONNECTER
42 OPTICAL CONNECTOR
421 INCIDENT PART
43 LENS
44 LENS
45 TUBULAR MEMBER

The invention claimed is:

1. A connecting apparatus for use in inspection of a semiconductor integrated circuit, the connecting apparatus comprising:
    an electric connector electrically connecting to an electrode terminal of the semiconductor integrated circuit;
    an optical connector optically connecting to an optical terminal of the semiconductor integrated circuit;
    a connector support substrate configured to support the electric connector and the optical connector, an end part of the electric connector and an end part of the optical connector respectively connecting to the semiconductor integrated circuit; and
    a light condensing substrate configured to condense light emitted by the optical terminal of the semiconductor integrated circuit to the optical connector, wherein
    the light condensing part is a through hole formed in a truncated cone shape in a thickness direction of the light condensing substrate, and a large aperture part of the light condensing part is located in a side of the optical terminal, while a small aperture part of the light condensing part is located in a side of the end part of the optical connector,
    an inner wall of the light condensing part is coated with a reflection film configured to reflect light, and
    some of the light emitted by the optical terminal is guided to the optical connector while being reflected by the reflection film.

2. The connecting apparatus according to claim 1, wherein
    the light condensing substrate has a light condensing part, and the light condensing part is configured to condense the light emitted by the optical terminal and guide the light to the optical connector.

3. The connecting apparatus according to claim 2, wherein the light condensing part is a through hole formed in a truncated cone shape in a thickness direction of the light condensing substrate, and a large aperture part of the light condensing part is located in a side of the optical terminal, while a small aperture part of the light condensing part is located in a side of the end part of the optical connector,
    an inner wall of the light condensing part is coated with a reflection film configured to reflect light, and
    some of the light emitted by the optical terminal is guided to the optical connector while being reflected by the reflection film.

4. The connecting apparatus according to claim 1, wherein the end part of the optical connector has an optical element configured to converge light coming from the small aperture part of the light condensing part.

5. The connecting apparatus according to claim 1, wherein the end part of the optical connector is contained in the light condensing part.

6. The connecting apparatus according to claim 1, wherein the large aperture part of the light condensing part has an optical element configured to converge the light emitted by the optical terminal.

7. The connecting apparatus according to claim 1, wherein the large aperture part of the light condensing part is formed in a size allowing radiation of the light emitted by the optical terminal.

* * * * *